United States Patent [19]
Amundson

[11] Patent Number: 5,493,676
[45] Date of Patent: Feb. 20, 1996

[54] SEVERE ENVIRONMENT DATA RECORDING SYSTEM

[75] Inventor: Dennis L. Amundson, Bloomington, Minn.

[73] Assignee: Unisys Corporation, Blue Bell, Pa.

[21] Appl. No.: 385,601

[22] Filed: Feb. 6, 1995

Related U.S. Application Data

[63] Continuation of Ser. No. 84,881, Jun. 29, 1993.

[51] Int. Cl.$^6$ ........................................... G06F 12/16
[52] U.S. Cl. ................ 395/183.18; 395/444; 395/182.05
[58] Field of Search ........................... 340/955; 395/575, 395/425; 371/5.5, 8.1; 364/245.3, 269.2, 268.5, 281.9, 424.04, 246.1, 268.9, 285.3, 944.61, 964, 970; 365/211

[56] References Cited

U.S. PATENT DOCUMENTS

| | | | |
|---|---|---|---|
| 4,156,286 | 5/1979 | Connors et al. | 365/45 |
| 4,450,559 | 5/1984 | Bond et al. | 371/10 |
| 4,525,839 | 6/1985 | Nozawa | 371/38 |
| 4,775,969 | 10/1988 | Osterlund | 369/53 |
| 4,796,247 | 1/1989 | Vogelsang | 369/44 |
| 4,942,579 | 7/1990 | Goodlander | 371/51 |
| 4,980,818 | 12/1990 | Shinmura | 364/200 |
| 5,034,914 | 7/1991 | Osterlund | 364/900 |
| 5,101,490 | 3/1992 | Getson | 395/425 |
| 5,184,338 | 2/1993 | Shimoda | 369/44.25 |
| 5,185,700 | 2/1993 | Bezos | 364/424.04 |
| 5,185,746 | 2/1993 | Tanaka | 371/40.2 |
| 5,185,876 | 2/1993 | Nguyen | 395/425 |
| 5,313,612 | 5/1994 | Satoh et al. | 395/425 |

*Primary Examiner*—Robert W. Beausoliel, Jr.
*Assistant Examiner*—Stephen C. Elmore
*Attorney, Agent, or Firm*—Steven P. Skabrat; Charles A. Johnson; Mark I. Starr

[57] ABSTRACT

An apparatus which includes one or more optical disk memory systems, one or more magnetic disk memory systems, and one semiconductor memory system, to store large amounts of data while operating under potentially severe environmental conditions. The preferred storage media for the apparatus is the optical disk memory system, but when environmental conditions do not permit successful operation of the optical disk memory, the apparatus switches storage of data to an alternate storage media such as magnetic disk memory or semiconductor memory until the severe environmental conditions subside. When environmental conditions subside, the optical disk memory is updated with the data stored on magnetic disk memory and semiconductor memory. Monitoring of environmental conditions is performed by the storage media systems, not by environmental sensors external to the system.

29 Claims, 7 Drawing Sheets

SEVERE ENVIRONMENT DATA RECORDING SYSTEM

This is a continuation of copending application Ser. No. 08/084,881 filed on Jun. 29, 1993.

BACKGROUND OF THE INVENTION

1. Field of the Invention

The invention relates generally to data processing systems. More specifically, it relates to data recording systems which must reliably store large amounts of data while operating in potentially severe environments.

2. Description of Related Art

It is well known that there exists multiple types of storage media on which to store data in a computer system. Mass storage devices such as magnetic tapes have been used for over 35 years to record and storage data. Magnetic tape is a sequential storage medium consisting of a long and flexible ribbon coated with magnetic material. Tapes used in these storage systems vary in width from ½" to ¼", with ½" as a commonly used width. The amount of data that can be stored on a magnetic tape depends on its length and recording density. Densities are available in 800, 1,600, or 6,250 bits per inch (BPI) for standard computer tapes. Storage capacities can range from 40 million bytes (MB) to 180 MB and beyond. Such standard magnetic tapes offer a relatively low-cost and proven media for archival storage. However, magnetic tapes are bulky and can be easily contaminated by improper handling or by being exposed to environmental dangers. Because magnetic tapes are sequential storage devices, the speed with which data can be located and retrieved is relatively slow. Additionally, the life span of the magnetic tape is limited. Over time, important information achieved on magnetic tapes may no longer be accessible because of the deterioration of the tape itself. Thus, using magnetic tapes as a preferred mass storage media is not ideal for many situations.

Magnetic disk memory replaced magnetic tape drives in many computer systems because they offered greater speeds and faster access to data due to randomly addressable access to selected tracks on the magnetic disk. The Winchester disk technology, developed by IBM Corporation, is widely used in the primary mass storage markets. Magnetic disk memory systems are known generally and are available in a variety of sizes, operational characteristics, and storage capacities. Examples of widely used magnetic disk memory systems are the Elite 5.24 inch STA41201J drive available from Seagate Technology Corporation, and the M2261 available from Fujitsu. Removable magnetic disk memories are also available, but the storage capacity of these disks is typically limited to around 100 MB. The commonly used magnetic disk memory systems are a popular and proven technology used by all categories of computer systems. They are sealed, low-maintenance products with a high mean-time between failure (MTBF). However, magnetic disk memory systems are vulnerable to shock, vibration, excessive temperatures, and electrical surges, as well as microscopic dust particle surface contamination.

In recent years optical storage devices have emerged as a promising storage technology because of their large storage capacities and compact format. There are three types of optical disk memory systems: read-only optical disks, which include CD-ROM; Write-Once-Read-Many (WORM) devices; and erasable optical disks, also known as Write-Many-Read-Always (WMRA) devices. Erasable optical disk memory systems come closest to functioning like magnetic disk memory systems because data can be stored, retrieved and written over with ease, and are made in a variety of sizes and capacities. Typical commercial WMRA systems offer between 256 MB and 650 MB per side of storage capacity on a 5.25" disk and support an interface to a computer via a generic I/O bus such as the Small Computer System Interface (SCSI), or the Intelligent Peripheral Interface (IPI), which is an ANSI standard interface. Optical disk memory systems available commercially include the RO-5030EII made by Richo Corp., the SMO-S501 made by Sony Corp. of America, the HP C1716A made by the Hewlett-Packard Co., and the OD112-1 made by Hitachi America. Ltd. Functionally, WNRA disks are rugged and offer massive storage capacities in removable cartridges. They can store multimedia categories of information including images, video, and digital audio that would not be cost effective on magnetic media.

Optical disks are less vulnerable to physical damage than magnetic disks or magnetic tapes. The optical disk media has a long archival life and can store massive amounts of data in a compact space, yet the data can be quickly retrieved. The cost per MB of storage is lower than for magnetic disks. However, the successful operation of an optical disk memory system is more prone to environmental challenges to data integrity than magnetic disk memory systems. Shock, vibration and other physical stresses can cause errors when reading data from or writing data to the optical disk. One solution to the problem of reading an optical disk when the system is subject to vibration and shock is disclosed in U.S. Pat. No. 4,796,247 to Vogelsang. Vogelsang teaches only that a look-ahead read/write memory can be used to compensate for tracking jumps due to vibration and shock during a read operation, but does not address the problems of writing an optical disk in an adverse environment. The table below shows the comparable bounds of safe, reliable operation of the optical disk memory, magnetic disk memory, and semiconductor memory (also known as solid state disk memory) systems.

| Characteristic | Environmental Characteristics of Storage Media | | |
| --- | --- | --- | --- |
| | Semiconductor Memory | Magnetic Disk Memory | Optical Disk Memory |
| Low Temperature | −55° C. | −20° C. | 0° C. |
| High Temperature | 125° C. | 90° C. | 50° C. |
| 100% Humidity | ~1000 Hours | 100 Hours | 1 Hour |
| Shock | ~1000 G's | 150 G's | 30 G's |
| Vibration | ~20 G's | 4 G's | 1 G |

There are significant environmental limitations on the successful disk memory system will not operate well in environments that are below freezing, consist of high humidity, or contain shocks and vibrations. The magnetic disk memory system performs better than the optical disk memory system in all factors measured. The semiconductor memory system is the most rugged and easily surpasses both the optical disk memory system and the magnetic disk memory system in severe environmental conditions.

The criteria used in selecting a mass storage media for a computer system includes many factors, including cost, storage capacity, access time, transfer rates, reliability, power consumption, physical size, ease of system integration, service and maintenance, and data security. What may be and ideal definition of a computer system in a commercial environment may be unacceptable in a severe environment. In severe environments the computer system may be subject to physical stresses, including temperature extremes, shock, vibration and high humidity. The failure of the mass storage media under these conditions can cause the computer system to be unusable, resulting in data loss or corruption and a potential negative impact on human safety.

The storage capacity of optical disks is very competitive with other forms of mass storage, but the performance of the optical disk memory system in a severe environment is rather poor. The magnetic disk drive is sturdier, but it does not have the storage capacity of the optical disk. Semiconductor memory is the most rugged storage media, but its storage capacity is limited as compared to the other storage media, especially under a cost per MB analysis. Based upon existing technologies, the current cost to storage one MB of data in semiconductor RAM is currently around $60; on a magnetic disk, the cost decreases to about $1.60 per MB; and on an optical disk, the cost drops to only about 16 cents per MB. There are great cost savings to be had by successfully using optical disks as the preferred mass storage medium, provided that the environmental limitations can be overcome.

There are many computer systems in use today that are required to operate in severe environmental conditions. These conditions may be present in factories, at sites in potential earthquake areas, on ground transportation, on board ships, submarines, aircraft, an other platforms that presently utilize magnetic tape technology for their mass storage media. On known shipboard systems, magnetic tapes are used to record the data transfers between computers on a ship and between a computer on a ship and the outside environment. These magnetic tapes hold about 40 MB; and, in peak periods of activity, a magnetic tape is filled with data and a new magnetic tape must be mounted on the tape drive by a computer operator every five minutes. Many of these computer systems are being swamped by the larger amounts of data being reported by new sensor systems. There is a need to replace the old technology with the latest in high-speed, high-storage computer technology which is readily available in the commercial market. Commercial computer equipment is ordinarily not designed to withstand the stresses of severe environmental conditions.

In regard to the optical disk memory system, there are no known commercially available systems that provide significant improvements in the outer limits of successful operation in severe environmental conditions. Additionally, the anticipated cost of a ruggedized optical disk memory system and associated ruggedized optical disk cartridges is prohibitively expensive; proposals project prices an order of magnitude higher than current commercial prices. These proposed optical disk memory systems still do not fulfill the typical severe environmental system requirements. Thus, optical disk memory systems are not available for use on these types of computer systems.

What is needed is a mechanism by which the advantages of the huge storage capability of optical disks can be combined with the reliable operation of magnetic disks and semiconductor memory in a flexible, cost-effective manner. The solution to this problem will be applicable to a variety of situations where reliability, access time, storage capacity, and cost are critical factors in determining the success of a computer system operating in a severe environment.

In a traditional memory hierarchy, strategies have been developed to store information in a storage media based on frequency of use and speed of access. Thus, the most frequently used information would be stored in the shortest access time memory such as a semiconductor memory; frequently used information would be stored on a magnetic disk; and infrequently used information would be stored with a relatively slow access time on an optical disk.

The memory allocation strategy is significantly different for a data recording system operating in a severe environment, such as a military mission, because of unique requirements. There the objective is to store all information on the optical disk in real-time. The optical disk is then removed when full or at the end of the mission for later analysis and/or archival purposes. The data may be required to be archived for at least 10 years. Optical disks are ideal for such mass storage and for fulfilling this long-term archival requirement. During the mission, in a computer system utilizing optical disks, magnetic disks, and semiconductor memory, information can be stored on any of these storage media, depending on the current environmental conditions. All information stored on the magnetic disk or the semiconductor memory must be merged into the information stored on the optical disk as time and conditions permit, thereby allowing a computer operator to remove the complete mission information stored on optical disk.

OBJECTS

The primary object of this invention is to provide a method and apparatus for storing information in a data recording system that may be exposed to severe environmental conditions.

A further object is to provide a data recording system utilizing multiple types of mass storage media capable of being selected for use in response to sensed environmental conditions.

Yet a further object of this invention is to provide a data recording system which utilizes the positive characteristics of various mass storage media by combining the use of optical disk memory systems, magnetic disk memory systems, and semiconductor memory such that the system as a whole operates effectively in severe environments.

Another object of this invention is to provide a data recording system capable of being operated in severe environments using optical disk, magnetic disk, and semiconductor memory technology that replaces existing data recording systems utilizing magnetic tape technology as a mass storage medium.

Yet another object of invention is to provide a data recording system that overcomes the environmental limitations of optical disk drives by using an intelligent storage controller to direct the storage of data onto an optical disk, a magnetic disk, or in semiconductor memory based upon the prevailing environmental conditions at the time the storage operation is required.

A further object of invention is to provide a data recording system that monitors selected environmental conditions on an optical disk memory system and causes recording to be switched to an alternative memory system when environmental conditions preclude successful operation of the optical disk storage system.

Still a further object of invention is to provide a data recording system that monitors in real time the effects of shock, vibration, temperature and humidity on an optical disk drive to overcome its environmental deficiencies by switching the storage of data to a magnetic disk memory system or a semiconductor memory system until the severe environmental conditions subside to levels safe for reliable recording by the optical disk drive.

Still a further object of invention is to provide a method of analyzing fault signals reported by an optical disk memory system in a data recording system when it cannot successfully operate in a severe environment, in order to redirect the storage of data in the system to a magnetic disk memory system or to a semiconductor memory system until the severe environmental conditions subside, at which time the data stored on the optical disk will be updated with the data stored on the magnetic disk or the semiconductor memory and subsequent data storage requests will be directed to the optical disk.

Another object of the invention is to provide a cost-effective data recording system utilizing multiple types of storage media operating in potentially severe environmental conditions.

Other more detailed objectives will become apparent from a consideration of the Drawings and the Detailed Description of the Preferred Embodiment.

SUMMARY OF THE INVENTION

The present invention is a data processing system and method used to record large amounts of data while operating in a potentially severe environment where the system may be subjected to shock, vibration, high humidity, and temperature extremes. This invention utilizes the inherent capabilities of optical disk memory systems and magnetic disk memory systems to report fault signals when data storage requests cannot be performed. The system includes an input device to receive the data to be recorded, a main storage device capable of storing the received data, fault detection apparatus that provides a fault signal when a predetermined sensed environmental condition exceeds a predetermined threshold of successful storage capability, at least one alternate storage device capable of storing the received data, and a storage controller to cause the recording of the received data on the main storage device in the absence of the fault signal and to cause recording of the received data on the alternate storage device when the fault signal is provided. The resulting implementation is accomplished without loss of data during switching of the preferred storage media, and is accomplished in a manner less costly than would otherwise be the case because no external environmental sensors are needed. It also eliminates the need for establishing failure thresholds for various storage media, guard banding these thresholds, and determining how multiple environmental extremes (such as temperature, vibration, shock, etc.) affect storage media operation. This invention automatically handles variations in the storage media's sensitivity to severe environments and uses each individual storage media to its fullest environmental potential.

DESCRIPTION OF THE PREFERRED EMBODIMENT

Figure 1:
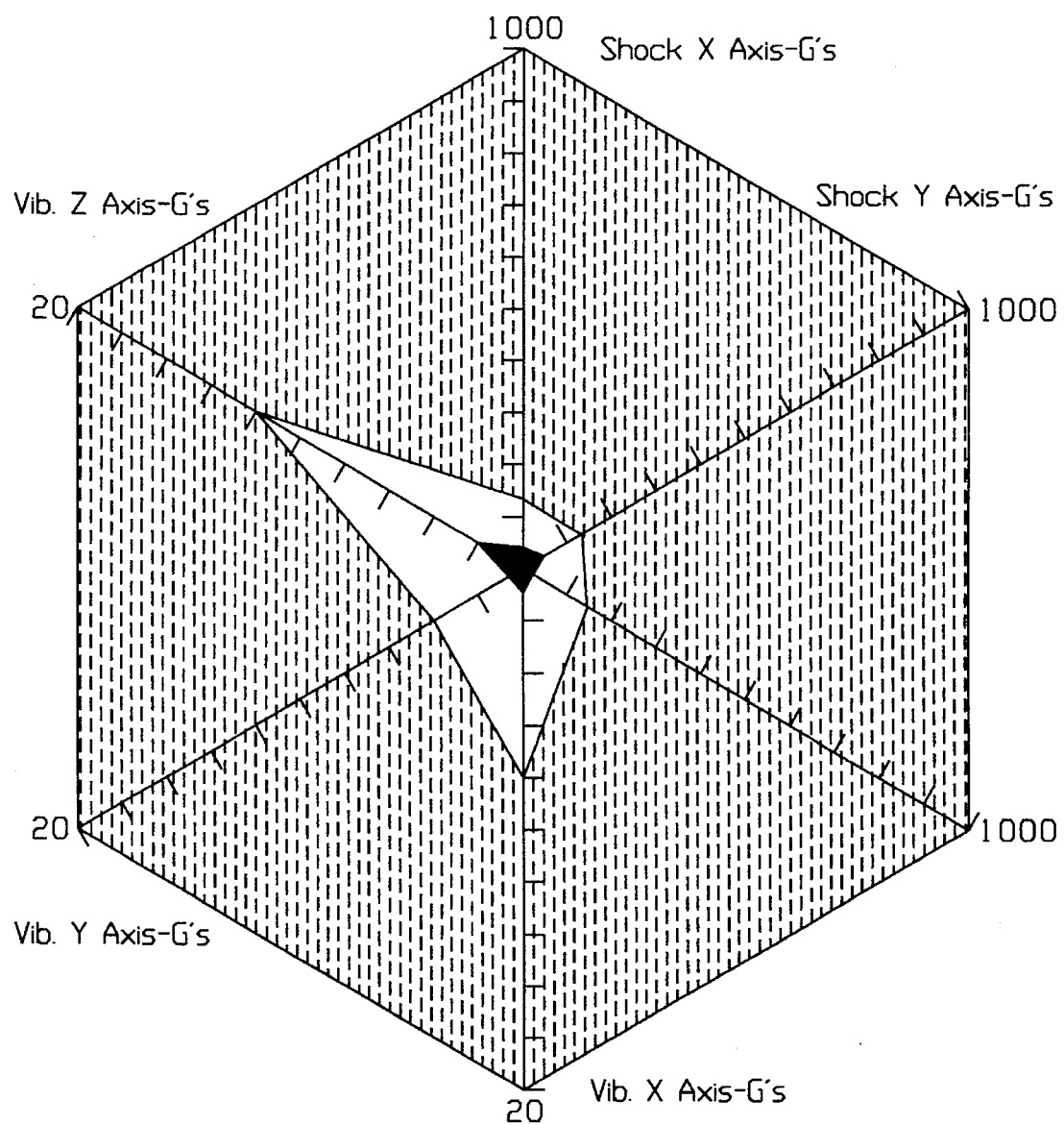
FIG. 1 is a diagram portraying the limits of successful operation of three storage media devices when subjected to shock and vibration (Prior Art).

FIG. 1 is a diagram portraying the limits of successful operation of three storage media devices when subjected to shock and vibration. These factors are very important for fulfilling system requirements for any computer system used by the military or in any other potentially severe environment. The diagram portrays the limits of successful operation when the storage device is subjected to shock and vibration in the X, Y, and Z axis. Both shock and vibration are measured in G's, the unit of gravitational force. Attempts by the storage media to write data outside of these limits results in error codes being reported. It is readily apparent from the diagram that the window of successful operation for the optical disk memory system is quite small when compared to that of the magnetic disk memory system or the semiconductor memory system. The present invention was made to overcome these limitations.

Figure 2:
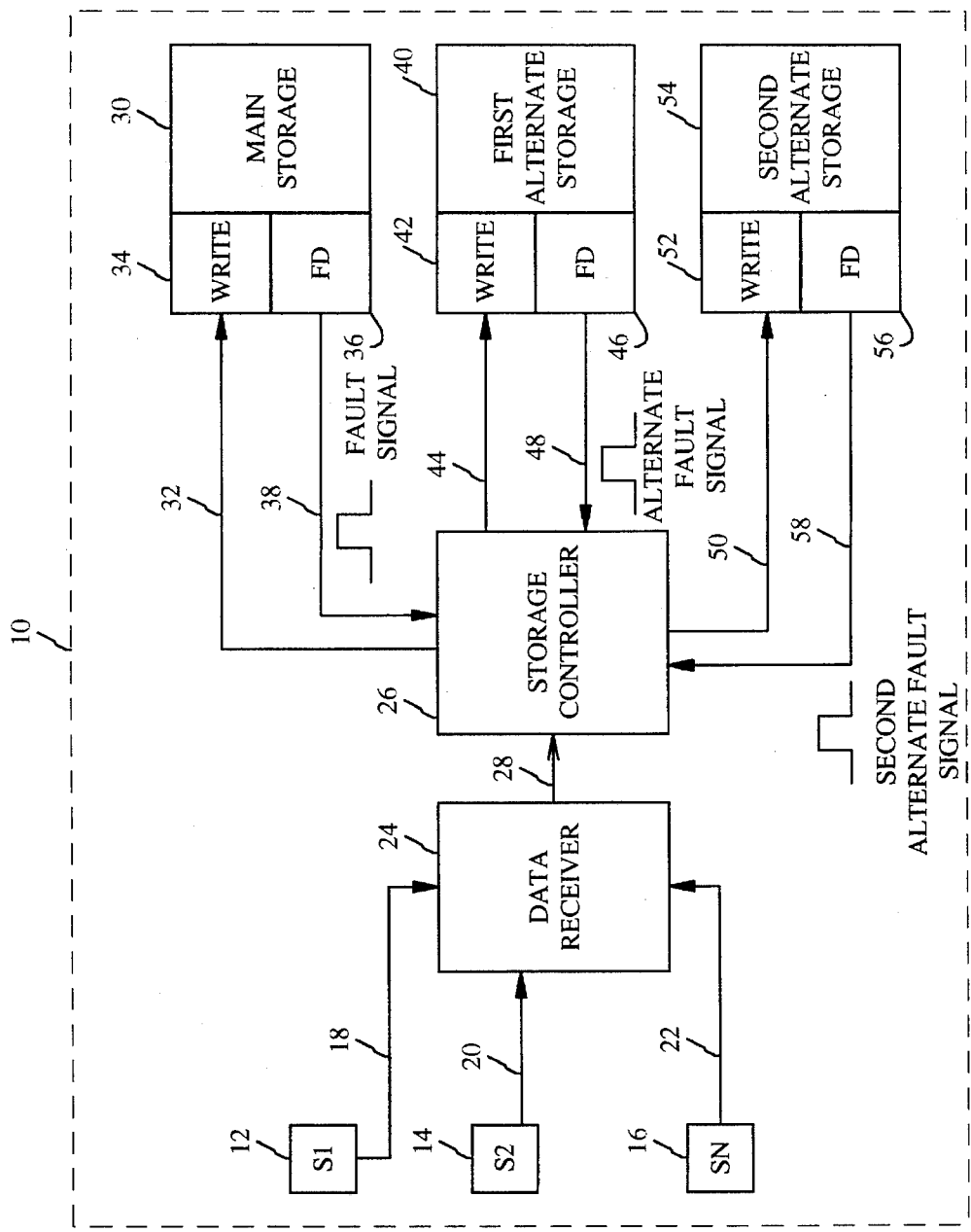
FIG. 2 is a block diagram of this invention.

FIG. 2 is a block diagram of this invention. A Data Recording System 10 receives data from one or more Sources S1, S2, and SN, labelled 12, 14 and 16, respectively. The Sources of data may be general purpose computers, real-time signal processors, or other components. Sources S1, S2, and SN transfer data over lines 18, 20, and 22, respectively, to a Data Receiver 24. The Data Receiver is an input device that manages the data transfers from the different types of Sources and forwards the data to the Storage Controller 26 via line 28. The Storage Controller temporarily stores the data in an internal queue until a request to store the data in a storage device can be made. The Storage Controller 26 also updates internal data structures which hold storage control information for all successful storage requests. The Storage Controller first attempts to store the data in Main Storage 30 by sending a storage request over line 32 to the Main Storage's Write apparatus 34. The Main Storage 30 contains a Fault Detection apparatus (FD) 36 that detects any errors, including those errors caused by severe environment conditions, that may occur during the processing of the storage request. If an error occurs, then a fault signal is sent back to the Storage Controller 26 via line 38.

The Storage Controller 26 then sends a storage request containing the data to the First Alternate Storage 40. The First Alternate Storage's Write apparatus 42 receives the storage request over line 44. The First Alternate Storage 40 also contains a Fault Detection apparatus 46, which detects any errors that occur and returns an alternate fault signal via line 48 to the Storage Controller 26. If an error does occur, then the Storage Controller sends a storage request containing the data via line 50 to the Write apparatus 52 of the Second Alternate Storage 54. The Second Alternate Storage also contains a Fault Detection apparatus 56 to detect errors occurring during the processing of the storage request. If an error occurs, a second alternate fault signal is sent to the Storage Controller 26 via line 58.

Figure 3:
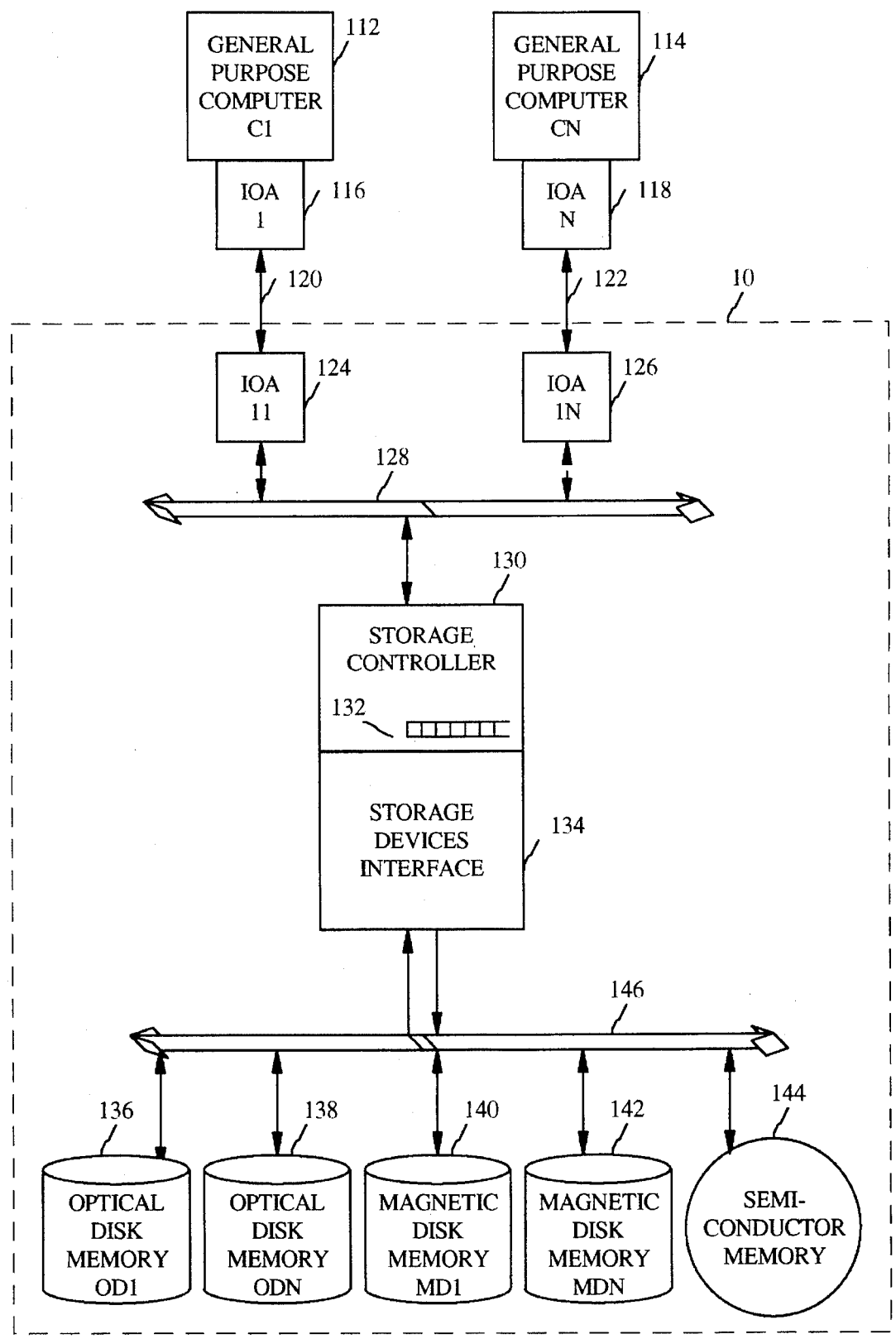
FIG. 3 is an overview diagram of the system architecture of this invention.

FIG. 3 is an overview diagram of the system architecture of this invention. A Data Recording System 10 operates with one or more general purpose Computers C1, CN, labelled 112 and 114, respectively. These Computers are present in the overall system environment and may be executing one or more application programs requiring data recording services. The general purpose Computers 112, 114 in the preferred embodiment are United States Navy standard AN/UYK-43s, but any other general purpose computer that will operate successfully in the selected environment may be used. Each general purpose Computer 112, 114 contains Input/Output Adapter circuitry IOA1, IOAN, labelled 116 and 118, respectively, to transmit data recording requests to the severe environment Data Recording System 10. Data recording requests are sent by IOA1 116, IOAN 118 via Input/Output Channels 120 and 122, respectively, which provide ports to receive the data recording requests sent over the Input/Output Channels 120, 122. The matching IOAs 116 and 124, or 118 and 126, must utilize the same protocol in order to function correctly, although different protocols could be used for different IOA pairs.

After the IOA circuitry 124, 126 receives the data recording requests, it passes the data recording requests via an Internal Bus 128 to a Storage Controller 130. The Storage Controller 130 in the preferred embodiment is a general purpose microprocessor such as the well-known Motorola 68030, or in an alternate embodiment, could consist of a personal computer, or other suitable control system. The Storage Controller 130 translates the data recording requests into storage requests and buffers the storage requests in a Storage Request Queue 132 stored in its internal memory. The Storage Request Queue is a data structure that allows the Storage Controller 130 to successfully process data recording requests from the IOA circuitry 124, 126 that are received at different rates than the completed storage operations to the mass storage devices.

The Storage Controller 130 is coupled to a Storage Devices Interface 134, which controls data transfers between the Storage Controller and the various storage devices. The storage devices include one or more Optical Disk Memory systems OD1, ODN, labelled 136 and 138, respectively, one or more Magnetic Disk Memory systems MD1, MDN, labelled 140 and 142, respectively, and a Semiconductor Memory system 144.

In the preferred embodiment, the Storage Devices Interface 134 supports the Small Computer System Interface (SCSI) American National Standard for Information Systems (ANSI) X3.131-1986 standard. Other implementations of this invention could support the Fast SCSI-2 standard, the Intelligent Peripheral Interface (IPI) standard, or other selected interface specifications. In any case, these standard interfaces are well-known and need not be described in further detail. This Storage Devices Interface 134 is connected via a SCSI bus 146 to a set of device controllers within each storage device which transmit and receive signals to and from the Storage Media 136, 138, 140, 142, and 144. Examples of these storage devices include the SMO-S501 optical disk memory system available from Sony Corporation of America, the Elite STA41201J 5.25 inch magnetic disk memory system and the ST868K solid state disk (semiconductor) memory system available form Seagate Technology Corporation. Future implementations of this invention could utilize optical disk memory jukebox systems.

The general flow of information in the system is as follows. One of the general purpose Computers C1 112 or CN 114, needs to storage data on a storage device for data recording purposes. The general purpose Computer C1 112 or CN 114 requests its IOA 116 or 118 to transmit a data recording request containing the data over the Input/Output Channel 124 or 126 to the Data Recording System 10. The Data Recording System's applicable IOA 124 or 126 receives the transmission and passes the data recording request to the Storage Controller 130. The Storage Controller translates the data recording request into a storage request and buffers the storage request in a Storage Request Queue 132. It then decodes the highest priority storage request in the Storage Request Queue and directs the Storage Devices Interface 134 to pass the data via the SCSI Bus 146 to one of the Optical Disk Memory systems OD1 136 or ODN 138, for storage on optical disk.

For some requests, however, the selected Optical Disk Memory system OD1 136 or ODN 138 cannot successfully store the data because of adverse environmental conditions such as temperature extremes, high humidity, shock or vibration. In these cases, the selected Optical Disk Memory system OD1 136 or ODN 138 reports a fault signal consisting of an error code back over the SCSI Bus 146 to the Storage Devices Interface 134, indicating that the selected Optical Disk Memory system OD1 136 or ODN 138 is unable to store the data. The Storage Devices Interface passes this error code back to the Storage Controller 130. Error codes as defined in the SCSI ANSI X3.131-1986 standard include indications that the device is not ready for communication, the storage medium is bad at the location addressed, the storage medium is full, and the attempted write was unsuccessful. The Storage Controller 130 responds to the error code by requesting the Storage Devices Interface 134 to store the data via the SCSI Bus 146 on one of the Magnetic Disk Memory systems MD1 140 or MDN 142.

For some requests the selected Magnetic Disk Memory system MD1 140 or MDN 142 may not successfully store the data because of adverse environmental conditions. In these cases, the selected Magnetic Disk Memory system MD1 or MDN reports an error code via the SCSI Bus 146 to the Storage Devices Interface 134, indicating that the selected Magnetic Disk Memory system MD1 or MDN is unable to store the data. The Storage Devices Interface passes this error code back to the Storage Controller 130. The Storage Controller interprets the error code and requests the Storage Devices Interface to store the data via the SCSI Bus 146 in Semiconductor Memory 144. If this request fails, then the Storage Devices Interface passes an error code back to the Storage Controller. The Storage controller notifies the general purpose Computer C1 112 or CN 114, via the Internal Bus 128 and IOA connections IOA11 124 to IOA1 116 or IOA1N 126 to IOAN 118, which initiated the storage request that cannot be performed.

In the preferred embodiment, the Storage Controller 130 is estimated to be idle (i.e., not buffering storage requests or directing the Storage Devices interface 134) about 75% of its execution time. During this idle time, the Storage Controller requests the Storage Devices Interface to fetch any data stored in Semiconductor Memory 144 or any data stored in the Magnetic Disk Memory systems MD1 140 and MDN 142 so the Storage Controller can direct the Storage Devices Interface to store the data on an optical disk in one of the Optical Disk, Memory systems OD1 136 or ODN 138. If the copy is successful, the Storage Controller 130 updates its internal data structures to reflect the change in storage location of this data. In this manner it is ensured that an optical disk in one of the Optical Disk Memory systems OD1 or ODN is updated with all data that was stored on the other storage devices during periods of severe environmental conditions.

Figure 4:
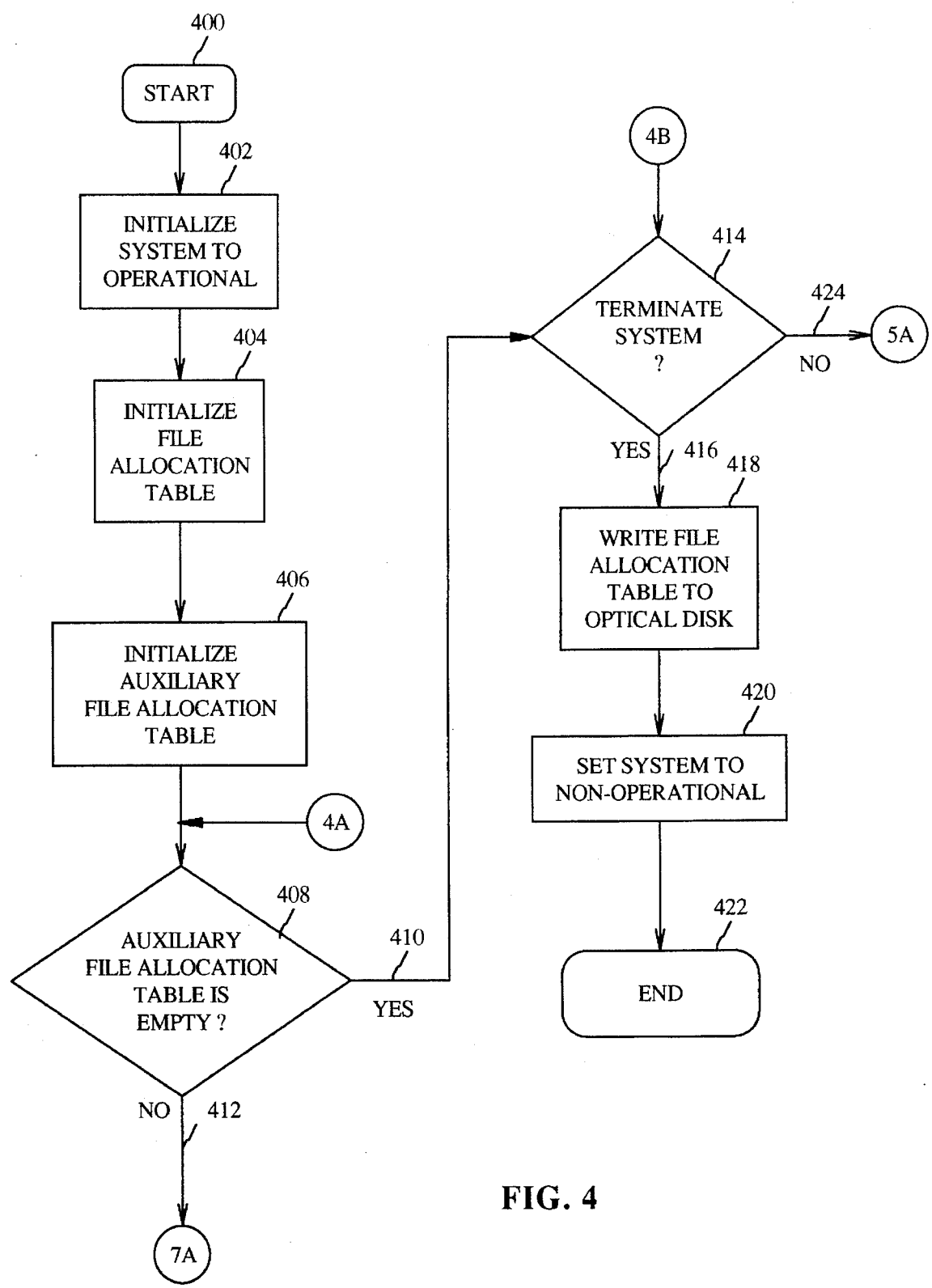
FIG. 4 is a flow chart depicting the process of initializing the Data Recording System and controlling system operation in an embodiment of the present invention.

FIG. 4 is a flowchart depicting the process of initializing the Data Recording System 10 and controlling system operation. The small circles with a number and a letter inside are flowchart connector symbols that signify inputs to this flowchart from another flowchart or outputs from this flowchart to another flowchart. For example, in FIG. 4, there are two inputs, 4A and 4B, and two outputs, 5A and 7A. The flow from flowchart connector 5A is an input to FIG. 5, and the flowchart connector 7A is an input to FIG. 7.

When the Data Recording System is powered up, it is in the Start 400 state. The Initialize System To Operational 402 step of the process initializes the Data Recording System to the operational state. Next, the Initialize File Allocation Table 404 operation initializes the File Allocation Table to an empty state. The File Allocation Table is a data structure managed by the Storage Controller 130 which holds the information necessary to store and retrieve one or more 512-byte blocks of 8-bit bytes to and from the Operation Disk Memory systems OD1 136 and ODN 138. It is essentially a directory of the file space that is allocated on the preferred mass storage media, the Optical Disk Memory systems OD1 136 and ODN 138. The information stored for each storage request includes the name of the file that the block(s) belongs to, the logical destination of the block(s) (i.e., the device it is stored on), the logical address where the block(s) is stored, the number of blocks in this storage request, and a time tag which is used to correlate this block(S) with other blocks of data.

The next step is to Initialize Auxiliary File Allocation Table 406 by initializing it to an empty state. The Auxiliary File Allocation Table is a data structure managed by the Storage Controller 130 which holds the information necessary to store and retrieve one or more blocks of data to and from one of the Magnetic Disk Memory systems MD1 140 or MDN 142 or the Semiconductor Memory system 144. It is essentially a directory of the file space that is allocated by the secondary mass storage media, the Magnetic Disk Memory systems MD1 and MDN and the Semiconductor Memory system. The addressing schemes used in these tables and the Optical Disk Memory systems OD1 136 and ODN 138, the Magnetic Disk Memory systems MD1 140 and MDN 142, and the Semiconductor Memory 144 are well-known as a result of the adoption of the SCSI and IPI standards. A mechanism such as is disclosed in U.S. Pat. No. 5,107,481 to Miki, et. al., may be used to store and manage the data on the Optical Disk Memory system. An example of each table is shown below.

| File Allocation Table | | | | |
|---|---|---|---|---|
| Time Tag | Destination | File name | Address | No. of Blocks |
| T1 | OD1 | ABC | N | 1 |
| T2 | OD1 | ABC | N + 1 | 4 |
| T4 | OD1 | ABC | N + 5 | 2 |
| T5 | OD1 | ABC | N + 7 | 1 |
| T7 | OD1 | ABC | N + 8 | 2 |

| Auxiliary File Allocation Table | | | | |
|---|---|---|---|---|
| Time Tag | Destination | File Name | Address | No. of Blocks |
| T3 | MD1 | ABC | M | 2 |
| T6 | MD1 | ABC | M + 4 | 2 |

In the File Allocation Table shown above, the first two storage requests were successfully performed and the data was stored on Optical Disk Memory system OD1 136. The third storage request was not performed successfully by an Optical Disk Memory system so the data was stored on the Magnetic Disk Memory system MD1 140. Similarly, data form the fifth and seventh storage requests were successfully stored on the Optical Disk Memory system OD1, but data from the sixth storage request was stored on the Magnetic Disk Memory system MD1. In this manner, the Storage Controller 130 keeps track of where each block of data is stored in the Data Recording System 10.

Figure 7:
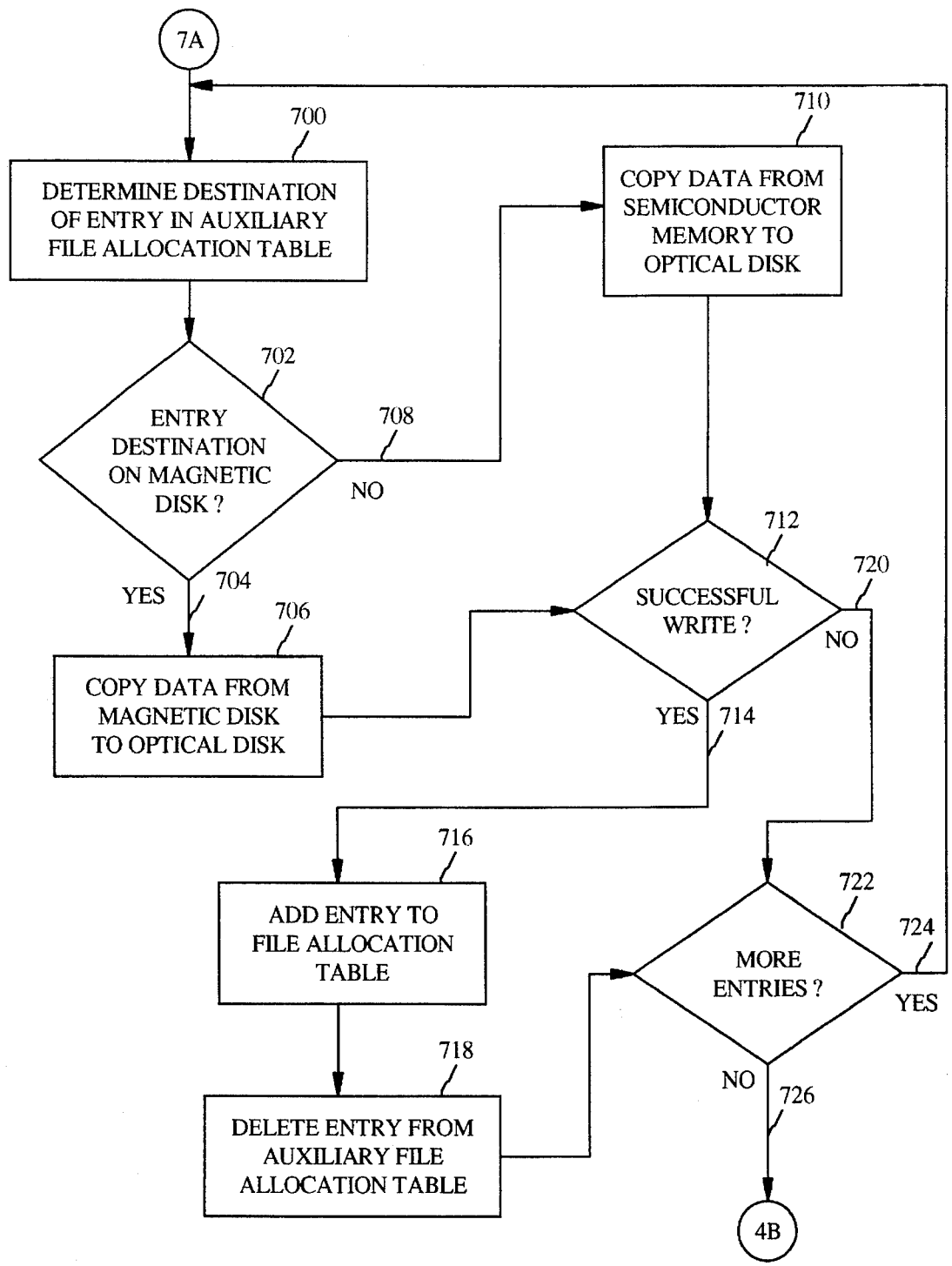
FIG. 7 is a flowchart depicting the process of updating an Optical Disk Memory system with data previously stored on one of the Magnetic Disk Memory Systems or in Semiconductor Memory in an embodiment of the present invention.

During the time the Storage Controller 130 is not processing requests from its IOAs 124 and 126, or directing the Storage Devices Interface 134 to store data on a storage device, the Storage Controller checks if the Auxiliary File Allocation Table Is Empty 408 to determine if any entries exist. Entries in the Auxiliary File Allocation mean that there is previously stored data on the Magnetic Disk Memory systems MD1 140 or MDN 142 or on the Semiconductor Memory system 144 that needs to be merged with the data on the Optical Disk Memory systems OD1 136 or ODN 138. At start time this is not necessary because the Auxiliary File Allocation Table is known to be empty so that Yes path 410 is taken. However, during later operation of the system, if after a successful write to optical disk takes place the Auxiliary File Allocation Table Is Empty 408 check is false, the No path 412 to point 7A in FIG. 7 is taken and the entries in the Auxiliary file Allocation Table must be processed.

After the Yes path 410 is taken, the Storage Controller 130 determines if there is a request to Terminate System 414. If system termination is necessary, the Yes path 416 is taken and the Write File Allocation Table To Optical Disk 418 operation is performed to update the optical disk with the compete File Allocation Table information that is maintained in the Storage Controller's internal memory. This data is needed on the optical disk so that future use of archival application programs are able to locate files on the optical disk. Next, the Set System To Non-Operational 420 step is performed and the Data Recording System 10 transitions to an End 422 state.

If it is not time to terminate the system, then the No path 424 is taken from the Terminate System 414 check. When a Storage Controller's IOA 124 or 126 has data to transfer, the Storage Controller immediately handles the data transmission and stores the resulting storage request ion the Storage Request Queue 132 for further processing.

Figure 5:
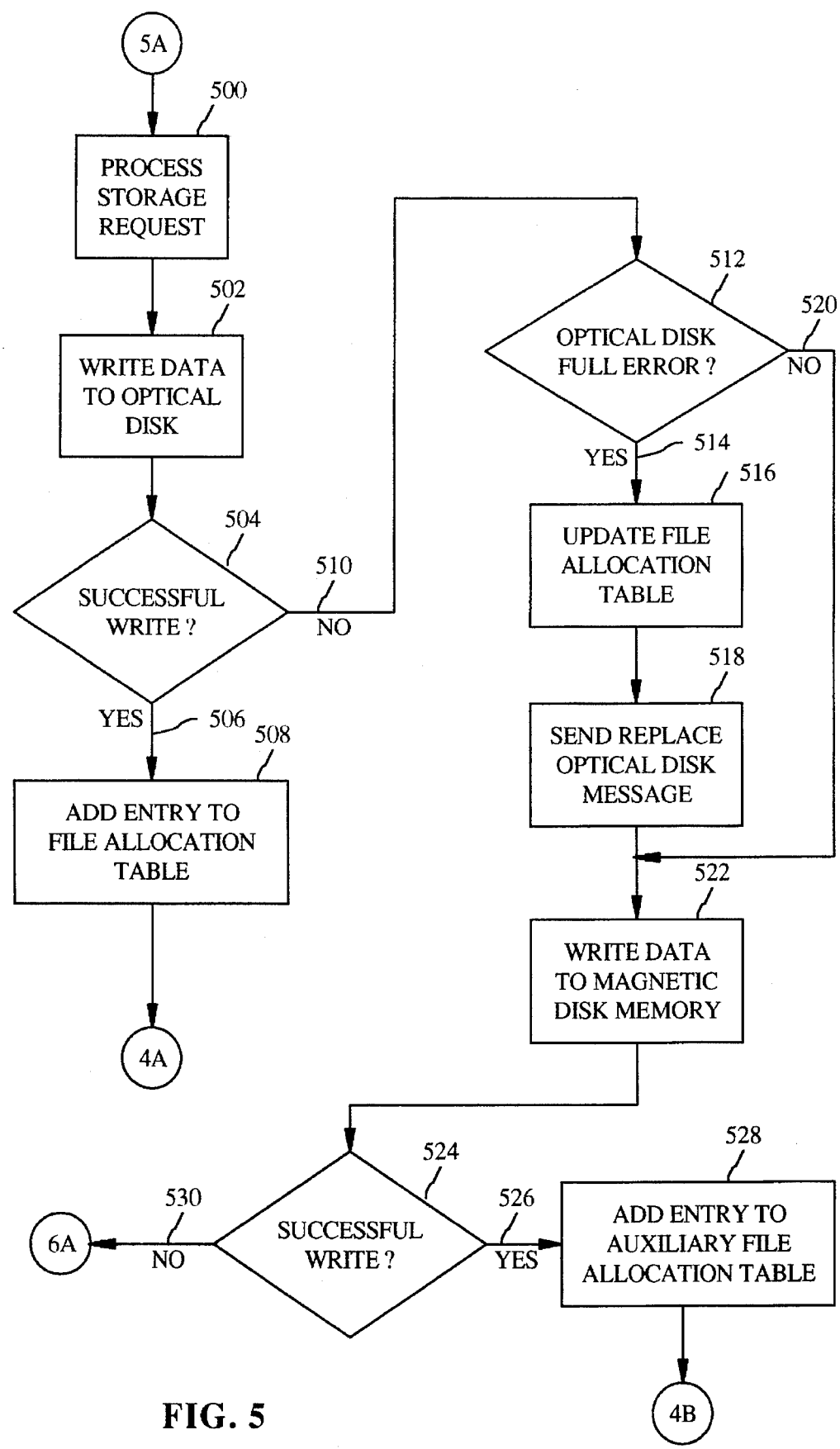
FIG. 5 is a flow chart representing the steps required to write data to Optical Disk Memory or Magnetic Disk Memory in an embodiment of the present invention.

FIG. 5 is a flowchart representing the steps required to write data to Optical Disk Memory or Magnetic Disk Memory. Referring now to FIG. 5, the Storage Controller 130 obtains a storage request from its Storage Request Queue 132, if available, and proceeds to Process Storage Request 500. It does this by fetching the storage request from the Storage Request Queue, interpreting the storage request, and attempting to perform a Write Data To Optical Disk 502 operation, utilizing the Storage Devices Interface 134 and the SCSI Bus 146. If a Successful Write 504 to an optical disk memory system OD1 136 or ODN 138 takes place, then the Yes path 506 is taken, and the Storage Controller 130 performs an Add New Entry To File Allocation Table operation 508 to reflect the successful storage of the data on optical disk. Processing then continues at point 4A with the Auxiliary File Allocation Table Is Empty 408 check on FIG. 4.

If the attempted write of data to the optical disk resulted in Successful Write 504 being false, the No path 510 is taken. If the error code returned to the Storage Controller 130 via the SCSI Bus 146 and the Storage Devices Interface 134 by the Optical Disk Memory system OD1 136 or ODN 138 indicates an Optical Disk Full Error 512, then the Yes path 514 is taken and the Storage Controller Writes applicable portions of its File Allocation Table to the selected Optical Disk Memory system OD1 136 or ODN 138, again utilizing the Storage Devices Interface 134 and the SCSI Bus 146 to do so. There is always storage set aside on each optical disk to store those portions of the File Allocation Table. The Storage Controller 130 then performs an Update File Allocation Table 516 operation to delete entries in the File Allocation Table for the newly full optical disk. The Storage Controller then notifies the general purpose Computer C1 112 or CN 114 which sent the storage request causing the optical disk full error that the optical disk needs to be replaced by performing the Send Replace Optical Disk Message 518 operation. When this step is taken or when a different error code was reported by the selected Optical Disk Memory system OD1 136 or ODN 138, resulting in the Optical Disk Full Error 512 step being false and the No path 520 being taken, then the current storage request is handled by attempting a Write Data To Magnetic Memory 522 operation.

IF the write to magnetic disk was a Successful Write 524, then the Yes path 526 is taken and the operation to Add Entry to Auxiliary File Allocation Table 528 is performed to update the Auxiliary File Allocation with information on the newly stored data. Processing then continues at point 4B with the Terminate System 414 check on FIG. 4. If the attempted Write Data TO Magnetic Disk Memory 522 operation is unsuccessful, the No path 530 is taken form the Successful Write 524 check to point 6A in FIG. 6.

Figure 6:
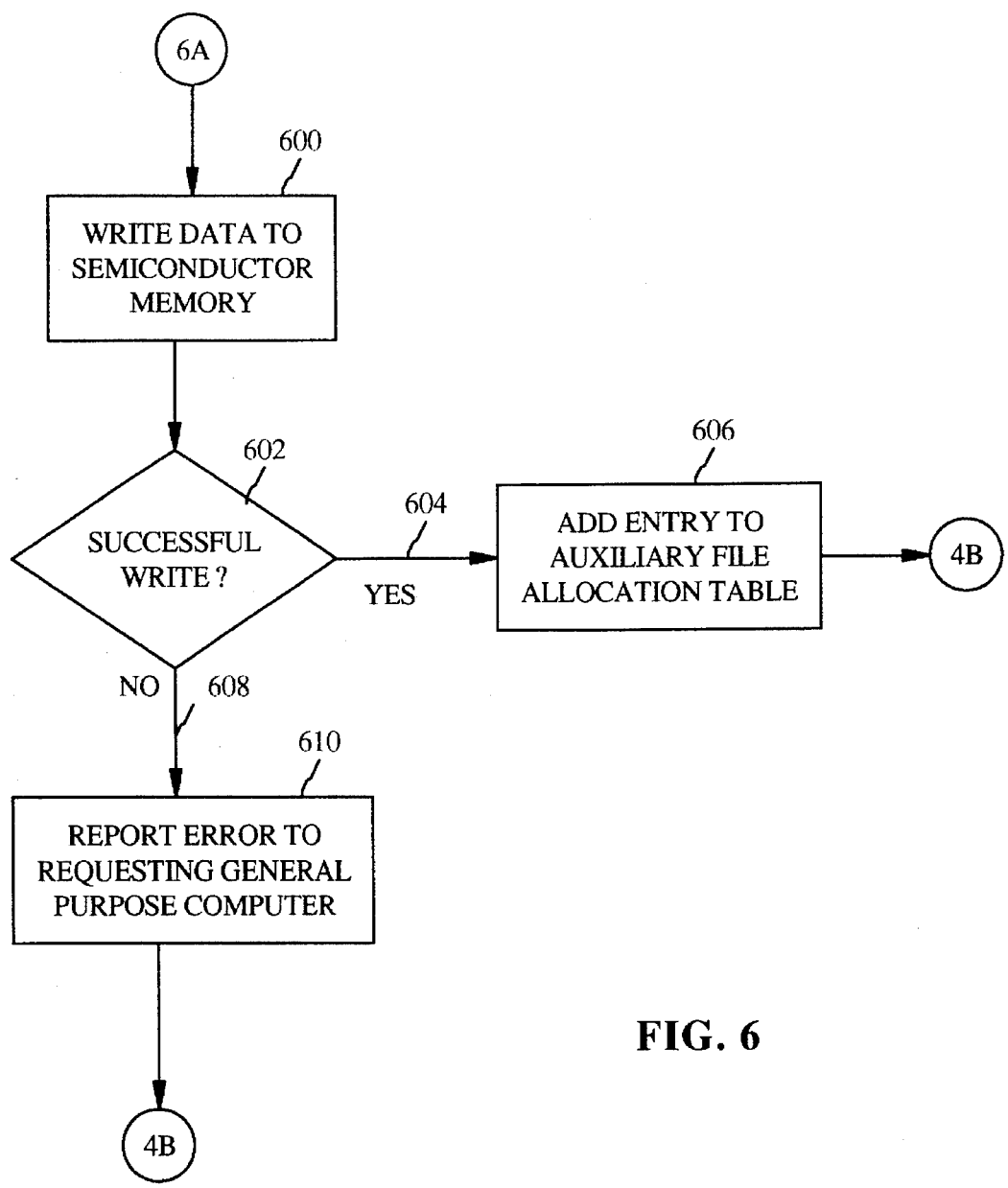
FIG. 6 is a flowchart depicting the process of writing data to the Semiconductor Memory in an embodiment of the present invention.

FIG. 6 is a flowchart depicting the process of writing data to the Semiconductor Memory. If the attempted Write Data to Magnetic Disk 522 operation is unsuccessful, the Storage Controller 130 attempts to Write Data To Semiconductor Memory 600. If this is a Successful Write 602, then Yes path 604 is taken and the Storage Controller performs an Add Entry To Auxiliary File Allocation Table 606 operation to reflect the successful storage of the data in Semiconductor Memory and processing continues at point 4B with the Terminate System 414 check on FIG. 4. If the Successful Write 602 is false, the No path 608 is taken and the Storage Controller performs a Report Error To Requesting General Purpose Computer operation 610 via the appropriate IOA 124 or 126. Processing then continues at point 4B with the Terminate System 414 check on FIG. 4.

The failure of the write operation on an optical disk in this system is usually due to temporary shock or vibration problems. The fault signal returned by the Optical Disk Memory systems OD1 136 and ODN 138 is used as an internal environmental sensor which indicates current conditions of operation. Every time a storage request is processed, the preferred storage media to be used is always the optical disk, thus a write to optical disk is always attempted first, even if immediately preceding attempts have failed. Because the environmental problems are usually transitory in nature, elaborate schemes or algorithms for tracking the current status and availability of the Optical Disk Memory systems are not necessary. It is hard to product the changes in environmental conditions; thus it is still efficient in most situations to always attempt a write to the optical disk first. With this approach, when severe conditions subside, the system resumes storing data on optical disk at the earliest possible time.

FIG. 7 is a flowchart depicting the process of updating an Optical Disk Memory system OD1 136 or ODN 138 with data previously stored on one of the Magnetic Disk Memory systems MD1 40 or MDN 42 or in Semiconductor Memory 144. The Storage Controller 130 first performs the Determine Destination Of Entry In Auxiliary File Allocation Table 700. If Entry Destination On Magnetic Disk 702 is true, then the Yes path 704 is taken and the Storage Controller directs the Storage Devices Interface 134 to Copy Data From Magnetic Disk To Optical Disk 706. If the Entry Destination On Magnetic Disk 702 is false, then the No path 708 is taken and the entry's destination is in Semiconductor Memory 144. The Storage Controller then directs the Storage Devices Interface to Copy Data From Semiconductor Memory To Optical Disk 710. In either case, if the attempted write is a Successful Write 712, then the Yes path 714 is taken and the Storage Controller performs an Add Entry To File Allocation Table 716 for the newly stored data. The Storage Controller performs a Delete Entry Form Auxiliary File Allocation Table 718 to remove the reference to the data being stored on an auxiliary memory. If the Successful Write 712 is false and the No path 720 is taken or if the write was successful and the tables have been updated, then a check is made to determine if any More Entries 722 are left to be processed in the Auxiliary File Allocation Table. If there are more entries to process, then the Yes path 724 is taken and processing continues at Determine Destination Of Entry In Auxiliary File Allocation Table 700. Otherwise the No path 726 is taken and processing continues at point 4B with the Terminate System 414 check on FIG. 4.

The severe environment Data Recording System 10 as described above meets its objectives by utilizing the error detection and reporting capabilities of the Optical Disk Memory systems OD1 136 or ODN 138, the Magnetic Disk Memory systems MD1 140 and MDN 142, and the Semiconductor Memory 144, to efficiently switch storage mediums for storage requests depending on the current environmental conditions.

One of the main advantages of the present invention is that it does not require the establishment by the Storage Controller 130 of predetermined error threshold levels in the storage media. There exists a large variation in environmental sensitivities for the same model of storage media. Failure testing of magnetic disk drives has shown a variation in vibration sensitivities from 5 Gs to 10 Gs with a sample size of five magnetic disk drives. If a predetermined threshold was to be set by the Storage Controller 130 so the next 100 disks would be guaranteed to work, the error threshold would have to be guard banded to roughly 1 to 2 Gs. With the present invention, the disk, whether optical or magnetic, is used to its fullest capability and automatically takes into account any aging effects associated with bearing wear, media variations, disk head wear, etc. Thus, in the preferred embodiment disclosed above, a magnetic disk may be used up to 10 Gs of vibration before an error signal will be issued. As the aging process takes place, this threshold may be reduced to 1 G. However, with the present invention, this does not pose any problems because of the automatic nature of the error detection process.

The present invention also solves the very difficult problem of the combined effects of multiple adverse environmental forces. If the storage media is being subjected to vibration, for example, along all three axes, the error threshold on the X axis may actually be less than shown in FIG. 1, because of the multiple forces. Acceleration, temperature extremes, and humidity may also be present that could further deteriorate the disk's ability to successfully store data. To equip an existing data recording system with instruments and sensors, coupled with a processor to execute the complex processing tasks involved, would be impractical. The present invention solves these problems.

The invention has been described in its presently contemplated best mode, and it is clear that it is susceptible to various modifications, modes of operation and embodiments, all within the ability and skill of those skilled in the art and without the exercise of further inventive activity. Accordingly, what is intended to be protected by Letters Patents is set forth in the appended Claims.

What is claimed is:

1. A fault tolerant data storage system having a hierarchy of multiple classes of storage devices for recording data without any data loss due to faults resulting from operating in severe environmental conditions, comprising:

an input device to receive the data to be recorded in real-time, at least one main storage device of a primary class of the storage hierarchy and having a first set of operational characteristics including a first level of fault tolerances for storing received data, said main storage device including fault detection apparatus providing a fault signal when a predetermined environmental condition exceeds one of said first level of fault tolerances, thereby preventing storing said received data in said at least one main storage device, at least one first alternate storage device of a secondary class of the storage hierarchy and having a second set of operational characteristics including a second level of fault tolerances, said second level of fault tolerances being substantially higher than said first level of fault tolerances, and a storage controller coupled to said input device to receive requests to store said received data, coupled to said at least one main storage device to direct the recording of said received data on said at least one main storage device and to receive said fault signal, and coupled to said at least one first alternate storage device to redirect the recording of said received data on said at least one first alternate storage device only when said fault signal is provided by said at least one main storage device, such that none of said received data is lost.

2. The fault tolerant data storage system of claim 1 wherein said at least one main storage device is an optical disk storage device.

3. The fault tolerant data storage system of claim 1 wherein said at least one first alternate storage device is a magnetic disk storage device.

4. The fault tolerant data storage system of claim 1 wherein said fault signal is provided when said received data cannot be stored due to any combination of excessive shock, vibration, or temperature extremes which exceed said first level of fault tolerances.

5. The fault tolerant data storage system of claim 1 wherein said at least one first alternate storage device further includes alternate fault detection apparatus providing an alternate fault signal when said predetermined environmental condition exceeds one of said second level of fault tolerances, thereby preventing storing said receiving data in said at least one first alternate storage device.

6. The fault tolerant data storage system of claim 5 wherein said alternate fault signal is provided when said received data cannot be stored due to any combination of excessive shock, vibration, or temperature extremes which exceed said second level of fault tolerances.

7. The fault tolerant data storage system of claim 5 and further including:

at least one second alternate storage device of a tertiary class of the storage hierarchy and having a third set of operational characteristics including a third level of fault tolerances, said third level of fault tolerances being substantially higher than said second level of fault tolerances, coupled to said storage controller, whereby said storage controller redirects the recording of said received data on said at least one second alternate storage device only when said alternate fault signal is provided by said at least one first alternate storage device, such that none of said received data is lost.

8. The fault tolerant data storage system of claim 7 wherein said at least one second alternate storage device is a semiconductor memory storage device.

9. A fault tolerant data storage system having a hierarchy of multiple classes of storage devices for recording data without any data loss due to faults resulting from operating in severe environmental conditions, comprising:

input means for receiving data to be recorded in real-time, main storage means of a primary class of the storage hierarchy and having a first set of operational characteristics including a first level of fault tolerances for storing said data, fault detection means coupled to said main storage means for providing an environmentally induced fault signal when a predetermined environmental condition exceeds one of said first level of fault tolerances, thereby preventing storing said received data in said main storage means, first alternate storage means of a secondary class of the storage hierarchy and having a second set of operational characteristics including a second level of fault tolerances, said second level of fault tolerances being substantially higher than said first level of fault tolerances, and storage controller means coupled to said input means for receiving requests to store received data, coupled to said main storage means for directing the recording of said data on said main storage means, coupled to said fault detection means for receiving said environmentally induced fault signal, and coupled to said first alternate storage means for redirecting the recording of said data on said first alternate storage means only when said environmentally induced fault signal is provided by said fault detection means, such that none of said received data is lost.

10. The fault tolerant data storage system of claim 9 and further including:

alternate fault detection means coupled to said first alternate storage means and said storage controller means for providing an alternate fault signal to said storage controller means when said predetermined environmental condition exceeds one of said second level of fault tolerances, thereby preventing storing said received data in said first alternate storage means.

11. The fault tolerant data storage system of claim 10 and further including:

second alternate storage means of a tertiary class of the storage hierarchy and having a third set of operational characteristics including a third level of fault tolerances, said third level of fault tolerances being substantially higher than said second level of fault tolerances, coupled to said storage controller means for storing said received data, whereby said storage controller means redirects the recording of said received data on said second alternate storage means only when said alternate fault signal is provided by said alternate fault detection means, such that none of said received data is lost.

12. A fault tolerant data recording system having a hierarchy of multiple classes of storage devices, the hierarchy including at least primary and secondary classes, the primary class having storage devices with a first set of operational characteristics including a first level of fault tolerances, the secondary class having storage devices with a second set of operational characteristics including a second level of fault tolerances which is substantially higher than the first level of fault tolerances, the fault tolerant data recording system operating to store data in a storage device of the secondary class only after an attempt to store the data in a storage device of the primary class has failed, for storing data received in a data recording request from an input/output adapter coupled to a general purpose computer, without any data loss due to faults resulting from operating in severe environmental conditions, comprising:

at least one input/output adapter connected to the input/output adapter of the general purpose computer to receive the data recording request, a storage controller connected to said input/output adapter including circuitry to receive the data recording request form said input/output adapter, a storage devices interface connected to said storage controller including circuitry to receive a storage request from said storage controller to store the data contained in the data recording request, at least one optical disk memory of the primary class of the storage hierarchy and having a first level of fault tolerances connected to said storage devices interface to store the data and to return a first fault signal when storage of the data fails due to a predetermined environmental condition exceeding one of said first level of fault tolerances, thereby preventing storage of the data by said at least one optical disk memory, at least one alternate memory of the secondary class of the storage hierarchy and having a second level of fault tolerances substantially higher than said first level of fault tolerances connected to said storage devices interface to store the data only when said at least one optical disk memory has returned said first fault signal and to return a second fault signal when storage of the data on said alternate memory fails due to said predetermined environmental condition exceeding one of said second level of fault tolerances, thereby preventing storage of the data by said at least one alternate memory.

13. The fault tolerant data recording system as recited in claim 12 wherein said at least one alternate memory is a magnetic disk memory.

14. The fault tolerant data recording system as recited in claim 12 wherein said at least one alternate memory is a semiconductor memory.

15. The fault tolerance data recording system as recited in claim 13 and having a tertiary class of the storage hierarchy, the tertiary class having at least one storage device with a third set of operational characteristics including a third level of fault tolerances whch is substantially higher than said second level of fault tolerances, the fault tolerant data recording system operating to store the data in a storage device of the tertiary class only after an attempt to store the data in said at least one alternate memory has failed, further including:

a semiconductor memory of the tertiary class of the storage hierarchy and having a third level of fault tolerances, said third level of fault tolerances being substantially higher than said second level of fault tolerances, connected to said storage devices interface to store the data only when said at least one alternate memory has returned said second fault signal to said storage devices interface.

16. The fault tolerant data recording system as recited in claim 12 wherein said storage controller includes:

means coupled to said storage devices interface for sending said storage request to said storage devices interface for transfer of the data to said at least one optical disk memory, means coupled to said storage devices interface for redirecting said storage request to said storage devices interface for transfer of the data to said at least one alternate memory when said first fault signal is received, and means for receiving said first fault signal via said storage devices interface from said at least one optical disk memory and said at least one alternate memory.

17. The fault tolerant data recording system of claim 16 further including means for periodically updating said at least one optical disk memory with the data stored on said at least one alternate memory such that said at least one optical disk memory stores a complete step of the data.

18. The fault tolerant data recording system as recited in claim 15 wherein said storage controller includes:

mean coupled to said storage devices interface for sending said storage request to said storage devices interface for transfer of the data to said at least one optical disk memory, means coupled to said storage devices interface for redirecting said storage request to said storage devices interface for transfer of the data to said at least one alternate memory only when said first fault signal is received, means coupled to said storage devices interface for redirecting said storage request to said storage devices interface for transfer of the data to said semiconductor memory only when said second fault signal is received, and means for receiving said first fault signal via said storage devices interface from said at least one optical disk memory, and fore receiving said second fault signal via said storage devices interface from said at least one alternate memory.

19. The fault tolerant data recording system of claim 18 further including means for periodically updating said at least one optical disk memory with the data stored on said at least one alternate memory and the data stored on said semiconductor memory such that said at least one optical disk memory stores a complete set of the data.

20. In a fault tolerant data storage system having a hierarchy of multiple classes of storage devices, the hierarchy including at least primary and secondary classes, the primary class having storage devices with a first set of operational characteristics including a first level of fault tolerances, the secondary class having storage devices with a second set of operational characteristics including a second level of fault tolerances which is substantially higher than the first level of fault tolerances, and comprising an input/output adapter for receiving a data recording request containing data to be stored, a storage controller connected to said input/output adapter for controlling storage of the data, a storage devices interface connected to said storage controller for transferring the data, at least one optical disk memory of the first class of the storage hierarchy and having a first level of fault tolerances, and at least one magnetic disk memory of the second class of the storage hierarchy and having a second level of fault tolerances, each optical disk memory and magnetic disk memory connected to said storage devices interface for storing the data, a method of recording data without any data loss while operating under severe environmental conditions comprising the steps of:

(a) receiving the data recording request to store the data, (b) storing the data on an optical disk memory, (c) receiving a first fault signal from said optical disk memory if the data cannot be reliably stored on said optical disk memory due to a predetermined environmental condition exceeding one of the first level of fault tolerances, (d) storing the data on a magnetic disk memory only if said first fault signal is received from said optical disk memory, and (e) updating periodically the data stored on said optical disk memory with the data stored on said magnetic disk memory, and removing the data stored on said magnetic disk memory.

21. In a fault tolerant data recording system having a hierarchy of multiple classes of storage devices the hierarchy including at least primary, secondary, and tertiary classes, the primary class having storage devices with a first set of operational characteristics including a first level of fault tolerances, the second class having storage devices with a second set of operational characteristics including a second level of fault tolerances which is substantially higher than the first level of fault tolerances, the tertiary class having storage devices with a third set of operational characteristics including a third level of fault tolerances which is substantially higher than the second level of fault tolerances, and comprising an input/output adapter for receiving a data recording request containing data to be stored, a storage controller connected to said input/output adapter for controlling storage of the data, a storage devices interface connected to said storage controller for transferring the data, at least one optical disk memory of the first class of the storage hierarchy and having a first level of fault tolerances, at least one magnetic disk memory of the second class of the storage hierarchy and having a second level of fault tolerances, and at least one semiconductor memory of the third class of the storage hierarchy and having a third level of fault tolerances, each storage device connected to the storage devices interface for storing the data, a method of recording data without any data loss while operating under severe environmental conditions comprising the steps the steps of:

(a) receiving the data recording request to store the data, (b) storing the data on an optical disk memory, (c) receiving a first fault signal form said optical disk memory if the data cannot be stored on said optical disk memory due to a predetermined environmental condition exceeding one of the first level of fault tolerances, (d) storing the data on a magnetic disk memory only if said first fault signal is received from said optical disk memory, (e) receiving a second fault signal from said magnetic disk memory if the data cannot be stored on said magnetic disk memory due to said predetermined environmental condition exceeding one of the second level of fault tolerances, (f) storing the data on a semiconductor memory only if said second fault signal is received from said magnetic disk memory, and (g) updating periodically the data stored on said optical disk memory with the data stored on said magnetic disk memory and the data stored on said semiconductor memory, and removing the data stored on said magnetic disk memory and said semiconductor memory.

22. A fault tolerant data recording system having a hierarchy of at least three classes of storage devices for storing data received in data recording requests from at least one input/output adapter connected to at least one general purpose computer, comprising:

at least one input/output adapter connected to the at least one input/output adapter of the at least one general purpose computer to receive the data recording requests;

a storage devices interface to receive a storage request to store the data contained in the data recording requests;

at least one optical disk memory of a primary class of the storage devices hierarchy, said at least one optical disk memory having a first set of operational characteristics including a first level of fault tolerances, said at least one optical disk memory connected to said storage devices interface to store the data and to return a first fault signal when storage of the data on said at least one optical disk memory fails due to a predetermined environmental condition exceeding one of said first level of fault tolerances;

at least one magnetic disk memory of a secondary class of the storage hierarchy, said at least one magnetic disk memory having a second set of operational characteristics including a second level of fault tolerances substantially higher than said first level of fault tolerances, said at least one magnetic disk memory connected to said storage devices interface to store the data only when said at least one optical disk memory has returned said first fault signal, and to return a second fault signal when storage of the data on said at least one magnetic disk memory fails due to said predetermined environmental condition exceeding one of said second level of fault tolerances;

at least one semiconductor memory of a tertiary class of the storage hierarchy, said at least one semiconductor memory having a third set of operational characteristics including a third level of fault tolerances substantially higher than said second level of fault tolerances, said at least one semiconductor memory connected to said storage devices interface to store the data only when said at least one magnetic disk memory has returned said second fault signal; and a storage controller connected to said at least one input/output adapter and said storage devices interface, said storage controller including means for receiving the data recording request from said input/output adapter;

means for sending said storage request to said storage devices interface for transfer of the data to said at least one optical disk memory;

means for redirecting said storage request to said storage devices interface for transfer of the data to said at least one magnetic disk memory only when said at least one optical disk memory returns said first fault signal to said storage controller via said storage devices interface;

means for redirecting said storage request to said storage devices interface for transfer of the data to said at least one semiconductor memory only when said at least one magnetic disk memory returns a second fault signal to said storage controller via said storage devices interface;

file allocation table means for storing table entries identifying where the data is stored on said at least one optical disk memory;

auxiliary file allocation table means for storing table entries identifying where the data is stored on said at least one magnetic disk memory and said at least one semiconductor memory; and means for periodically updating said at least one optical disk memory with the data stored on said at least one magnetic disk memory and the data stored on said at least one semiconductor memory according to said table entries stored by said file allocation table means and said auxiliary file allocation table means such that said at least one optical disk memory stores a complete set of the data contained in the data recording requests, and the data is removed from said at least one magnetic disk memory and said at least one semiconductor memory.

23. In a fault tolerant data recording system having a hierarchy of at least three classes of storage devices, the hierarchy including at least primary, secondary, and tertiary classes, the primary class having storage devices with a first set of operational characteristics including a first level of fault tolerances, the secondary class having storage devices with a second set of operational characteristics including a second level of fault tolerances which is substantially higher than the first level of fault tolerances, the tertiary class having storage devices with a third set of operational characteristics including a third level of fault tolerances which is substantially higher than the second level of fault tolerances, and having an input/output adapter for receiving a data recording request containing data to be stored, a storage controller connected to the input/output adapter for controlling storage of the data, a storage devices interface connected to the storage controller for transferring the data to one of a plurality of storage devices including at least one optical disk memory of the primary class of the storage hierarchy and having a first level of fault tolerances, at least one magnetic disk memory of the secondary class of the storage hierarchy and having a second level of fault tolerances, and at least one semiconductor memory of the tertiary class of the storage hierarchy and having a third level of fault tolerances, each storage device connected to the storage devices interface for storing the data, a file allocation table having table entries identifying where the data is stored on the at least one optical disk memory, and an auxiliary file allocation table having table entries identifying where the data is stored on the at least one magnetic disk memory and the at least one semiconductor memory, a method of recording data without any data loss while operating under severe environmental conditions comprising the steps of:

(a) receiving the data recording request to store the data from the input/output adapter, (b) storing the data on the optical disk memory, (c) receiving a first fault signal form the optical disk memory when the data cannot be stored on the optical disk memory due to a predetermined environmental condition exceeding one of the first level of fault tolerances, (d) creasing a table entry in the file allocation table to identify where the data is stored on the optical disk memory when said first fault signals not received from the optical disk memory, (e) storing the data ton the magnetic disk memory only if said first fault signal is received from the optical disk memory, (f) receiving a second fault signal form the magnetic disk memory when the data cannot be stored on the magnetic disk memory due to said predetermined environmental condition exceeding one of the second level of fault tolerances, (g) creating a first table entry in the auxiliary file allocation table to identify where the data is stored on the magnetic disk memory when said second fault signal is not received from the magnetic disk memory, (h) storing the data on the semiconductor memory only if said second fault signal is received from the magnetic disk memory, (i) creating a second table entry in the auxiliary file allocation table to identify where the data is stored on the semiconductor memory, (j) updating periodically the data stored on the optical disk memory with the data stored on the magnetic disk memory and the data stored on the semiconductor memory based on said table entries in the file allocation table and said first table entries and said second table entries in the auxiliary file allocation table and removing the data stored on the magnetic disk memory and the semiconductor memory, and (k) updating the file allocation table and the auxiliary file allocation table to reflect changes in storage locations of the data as a result of periodic updates performed in Step (j).

24. For use in recording data in an environment having varying levels of environmental disturbance, a fault tolerant data storage system comprising:

an input device to receive data to be recorded;

a first storage device for reliably storing data up to a first level of environmental disturbance, and including a first fault circuit to provide a first fault signal when said first storage device is subjected to a level of environmental disturbance greater than said first level of environmental disturbance;

a second storage device for reliably storing data up to a second level of environmental disturbance, wherein said second level is greater than said first level; and a storage controller coupled to said input device to receive requests to store data, coupled to said first storage device to direct the recording of data on said first storage device and to receive said first fault signal, and coupled to said second storage device to redirect the recording of data on said second storage device only when said first fault signal is provided by said first fault circuit.

25. The fault tolerant data storage system of claim 24, wherein said first storage device has a first data recording rate and said second storage device has a second data recording rate higher than said first data recording rate.

26. The fault tolerant data storage system of claim 25, wherein said second storage device further includes a second fault circuit to provide a second fault signal when said second storage device is subjected to a level of environmental disturbance greater than said second level of environmental disturbance such that said second storage device cannot reliably record data.

27. The fault tolerant data storage system of claim 26, and further including a third storage device for reliably storing data up to a third level of environmental disturbance, wherein said third level is higher than said second level, said storage controller being further coupled to said second fault circuit and said third storage device to redirect the recording of data on said third storage device only when said second fault signal is provided by said second fault circuit.

28. The fault tolerant data storage system of claim 27, wherein said third storage device has a third data recording rate higher than said first data recording rate and higher than said second data recording rate.

29. The fault tolerant data storage system of claim 28, wherein said first storage device is an optical disk drive, said second storage device is a magnetic disk drive, and said third storage device is a semiconductor memory device.

* * * * *

UNITED STATES PATENT AND TRADEMARK OFFICE
CERTIFICATE OF CORRECTION

PATENT NO. : 5,493,676
DATED : February 20, 1996
INVENTOR(S) : Dennis L. Amundson It is certified that error appears in the above-indentified patent and that said Letters Patent is hereby corrected as shown below:

Column 2, Line 11, delete "Richo" and substitute -- Ricoh --.

Column 2, Line 14, delete "WNRA" and substitute -- WMRA --.

Column 7, Line 16, between "respectively," and "which" add -- according to a predetermined request/acknowledge protocol. The Data Recording System 10 provides a plurality of matching IOAs IOA11, IOA1N, labeled 124 and 126, respectively,--

Column 7, Line 61, delete "form" and substitute -- from --.

Column 7, Line 67, delete "storage" and substitute -- store --.

Column 8, Line 62, delete "," between Disk Memory.

Column 9, Line 21, delete "Operation" and substitute -- Optical --.

Column 10, Line 36, delete "file" and substitute --File --.

Column 10, Line 42, delete "compete" and substitute -- complete --.

Column 11, Line 31, delete "IF" and substitute -- If --.

Column 11, Line 37, delete "TO" and substitute -- To --

UNITED STATES PATENT AND TRADEMARK OFFICE
CERTIFICATE OF CORRECTION

PATENT NO. : 5,493,676

DATED : February 20, 1996

INVENTOR(S) : Dennis L. Amundson

It is certified that error appears in the above-indentified patent and that said Letters Patent is hereby corrected as shown below:

Column 11, Line 38, delete "form" and substitute -- from --.

Column 11, Line 67, delete "product" and substitute -- predict --.

In Claim 5, Column 13, Line 66, delete "receiving" and substitute -- received --.

In Claim 18, Column 16, Line 52, delete "fore" and substitute -- for --.

In Claim 20, Column 17, Line 58, delete "form" and substitute -- from --.

In Claim 23, Column 20, Line 5, delete "creasing" and substitute -- creating --.

In Claim 23, Column 20, Line 12, delete "form" and substitute --from --.

Signed and Sealed this

Fourth Day of June, 1996

Attest:

BRUCE LEHMAN

*Attesting Officer*            *Commissioner of Patents and Trademarks*